United States Patent
Romalis et al.

(10) Patent No.: US 11,953,569 B2
(45) Date of Patent: Apr. 9, 2024

(54) SYSTEM AND METHOD FOR FEMTOTESLA DIRECT MAGNETIC GRADIOMETER USING A MULTIPASS CELL

(71) Applicant: The Trustees of Princeton University, Princeton, NJ (US)

(72) Inventors: Michael Romalis, Princeton, NJ (US); Nezih Dural, Bordentown, NJ (US); Vito-Giovanni Lucivero, Barcelona (ES); Wonjae Lee, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 237 days.

(21) Appl. No.: 17/519,826

(22) Filed: Nov. 5, 2021

(65) Prior Publication Data

US 2022/0137162 A1     May 5, 2022

Related U.S. Application Data (60) Provisional application No. 63/110,020, filed on Nov. 5, 2020.

(51) Int. Cl.
*G01R 33/26* (2006.01)
*G02B 5/30* (2006.01)
(Continued)

(52) U.S. Cl.
CPC ........... *G01R 33/26* (2013.01); *G02B 17/004* (2013.01); *G02B 17/0626* (2013.01);
(Continued)

(58) Field of Classification Search
None
See application file for complete search history.

(56) References Cited

U.S. PATENT DOCUMENTS 4,368,983 A * 1/1983 Bennett ................ G01N 21/031
356/445
5,615,043 A * 3/1997 Plaessmann .......... H01S 3/2325
359/347

(Continued)

OTHER PUBLICATIONS

Zhang et al., "portable intrinsic gradiometer for ultra-sentitive detection of magnetic gradient in unshielded environment", Applied Physics Letters, vol. 16, pp. 143501-1-143501-4, Apr. 7, 2020.

(Continued)

*Primary Examiner* — Jay Patidar
(74) *Attorney, Agent, or Firm* — MEAGHER EMANUEL LAKS GOLDBERG & LIAO, LLP (57) ABSTRACT

According to various embodiments, a direct magnetic gradiometer having intrinsic subtraction of rotation signals from two oppositely polarized atomic ensembles within a single multi-pass cell is disclosed. The gradiometer includes three convex spherical mirrors aligned in a V-shape geometry. The three convex spherical mirrors include a front mirror and two back mirrors. The gradiometer further includes a probe laser beam. The laser beam is configured to be initially focused at a near-zero angle into a hole at a center of the front mirror such that the laser beam expands at the back mirrors and nearly overlaps with itself while undergoing multiple reflections between the front and back mirrors. The laser beam is further configured to be refocused to the front mirror at different spots in a number equal to half of total beam passes before exiting.

19 Claims, 8 Drawing Sheets

(51) Int. Cl.
*G02B 17/00* (2006.01)
*G02B 17/06* (2006.01)
*G02B 27/28* (2006.01)
*G02B 27/30* (2006.01)

(52) U.S. Cl.
CPC .......... *G02B 5/3083* (2013.01); *G02B 27/283* (2013.01); *G02B 27/30* (2013.01)

(56) References Cited

U.S. PATENT DOCUMENTS

| | | | |
|---|---|---|---|
| 9,250,175 B1* | 2/2016 | McManus | G01J 3/021 |
| 2011/0193555 A1* | 8/2011 | Sugioka | G01R 33/032 |
| | | | 324/244.1 |
| 2017/0139182 A1* | 5/2017 | Sawyers | G01J 3/42 |
| 2020/0200839 A1* | 6/2020 | Palacios Laloy | G01R 33/0322 |

OTHER PUBLICATIONS

Perry et al., "All-optical intrinsic atomic gradiometer with sub-20 ft/cm/ √HZ sensitivity in a 22 µT earth-scale magnetic field", Optics Express, vol. 28, No. 24. Nov. 23, 2020.
Sheng et al., "Subfemtotesla Scalar Atomic Magnetometry Using Multipass Cells", Physical Review Letters, vol. 110, pp. 160802-1-160802-5, Apr. 19, 2013.

\* cited by examiner

*FIG. 4*

SYSTEM AND METHOD FOR FEMTOTESLA DIRECT MAGNETIC GRADIOMETER USING A MULTIPASS CELL

CROSS-REFERENCE TO RELATED APPLICATIONS

This application claims priority to provisional application 63/110,020, filed Nov. 5, 2020, which is herein incorporated by reference in its entirety.

STATEMENT REGARDING FEDERALLY SPONSORED RESEARCH OR DEVELOPMENT

This invention was made with government support under Grant No. 140D6318C0020 awarded by the Defense Advanced Research Projects Agency (DARPA). The government has certain rights in the invention.

FIELD OF THE INVENTION

The present invention relates generally to magnetometers and more particularly to systems and methods for an intrinsic magnetic gradiometer based on a multipass cell with increased beam overlap.

BACKGROUND OF THE INVENTION

Operation of sensitive magnetic sensors in unshielded environments, including Earth's magnetic field and ambient noise, requires robust subtraction of common mode magnetic signals. Environmental noise suppression is a major challenge for several applications, such as non-invasive magnetoencephalography (MEG) and magnetocardiography (MCG), magnetic anomaly detection, archeology, mineral exploration, and search for unexploded ordnances. The usual way of getting high noise cancellation and sensitivity improvement is to implement a magnetic gradiometer scheme.

Highly sensitive gradiometers are based on optically pumped magnetometers (OPMs), the most sensitive devices to measure low frequency magnetic fields to date and have been developed using either a single vapor cell with a multi-element photodiode in the spin-exchange-relaxation-free (SERF) regime and at finite fields or by using two microfabricated or cm vapor cells reaching sub-femtotesla sensitivity in multipass configurations. Another promising approach is based on an actively shielded array of OPMs and it has been implemented in MEG. However, for these approaches, the signals are typically subtracted electronically after detection, causing less noise rejection and leading to a decreased dynamic range of the gradiometer.

SUMMARY OF THE INVENTION

According to various embodiments, a direct magnetic gradiometer having intrinsic subtraction of rotation signals from two atomic ensembles within a single multi-pass cell is disclosed. The two atomic ensembles are polarized in opposite direction by a pump laser beam. The gradiometer includes three convex spherical mirrors aligned in a V-shape geometry. The three convex spherical mirrors include a front mirror and two back mirrors. The gradiometer further includes a probe laser beam. The laser beam is configured to be initially focused at a near-zero angle into a hole at a center of the front mirror such that the laser beam expands at the back mirrors and nearly overlaps with itself while undergoing multiple reflections between the front and back mirrors. The laser beam is further configured to be refocused to the front mirror at different spots in a number equal to half of total beam passes before exiting.

According to various embodiments, an optical arrangement is disclosed. The optical arrangement includes a laser beam configured to be focused into an arrangement of at least three convex spherical mirrors. The mirrors are pre-aligned to expand the laser beam such that the laser beam nearly overlaps with itself while undergoing multiple reflections between the mirrors and then exits the arrangement of mirrors after a predetermined number of beam passes.

According to various embodiments, a method for operating an optical arrangement is disclosed. The optical arrangement includes a laser beam and three convex spherical mirrors aligned in a V-shape geometry. The three convex spherical mirrors include a front mirror and two back mirrors. The method includes initially focusing the laser beam at a near-zero angle into a hole at a center of the front mirror such that the laser beam expands at the back mirrors and nearly overlaps with itself while undergoing multiple reflections between the front and back mirrors. The method further includes refocusing the laser beam to the front mirror at different spots in a number equal to half of total beam passes before exiting.

Various other features and advantages will be made apparent from the following detailed description and the drawings.

BRIEF DESCRIPTION OF THE DRAWINGS

In order for the advantages of the invention to be readily understood, a more particular description of the invention briefly described above will be rendered by reference to specific embodiments that are illustrated in the appended drawings. Understanding that these drawings depict only exemplary embodiments of the invention and are not, therefore, to be considered to be limiting its scope, the invention will be described and explained with additional specificity and detail through the use of the accompanying drawings, in which.

DETAILED DESCRIPTION OF THE INVENTION

Generally disclosed herein are embodiments for a direct gradiometer using optical pumping with opposite circular polarization in two $^{87}$Rb atomic ensembles within a single multipass cell. A far-detuned probe laser undergoes a near-zero paramagnetic Faraday rotation due to the intrinsic subtraction of two contributions exceeding 3.5 rad from the highly polarized ensembles. Here, the signals are subtracted optically before detection to improve noise rejection and increase the dynamic range of the gradiometer. Further generally disclosed herein are analysis methods for the direct gradiometer signal. A gradiometer sensitivity of 10.1 fT/√Hz is measured. It is demonstrated herein that embodiments of the disclosed multipass configuration, in addition to increasing the optical depth, provide a fundamental advantage due to the significantly reduced effect of atomic diffusion on the spin time-correlation.

Embodiments of the multi-pass optical cavity configuration disclosed herein uses a 3-mirror "V"-shape geometry that has several advantages. It uses a single probe laser beam that passes repeatedly through two atomic ensembles that are polarized in opposite directions. As a result, their optical rotation signals subtract, allowing for direct differential measurements. The direct cancellation of Faraday rotation from highly polarized ensembles also avoids the complication of polarimeter signal wrap-around when the optical rotation exceeds π radians in multipass geometry. In addition, the optical configuration of the V-shaped multi-pass cell allows the laser beams to expand and overlap on multiple passes through the atomic ensembles. This reduces diffusion broadening and increases correlation of spin measurements, unlike previous multi-pass cells that used distinct non-overlapping beams which were detrimental for possible sensitivity improvement by spin squeezing. At the same time, the probe laser beam in the V-shaped multi-pass cell remains focused on one of the mirrors, which allows the laser to exit the cavity after a specific number of passes, in contrast to typical standing wave optical cavities. It also simplifies signal processing in the high-density and high-polarization regime where partial suppression of spin-exchange relaxation causes highly non-linear spin evolution.

Sensor Configuration and Experimental Setup

Figure 1A:
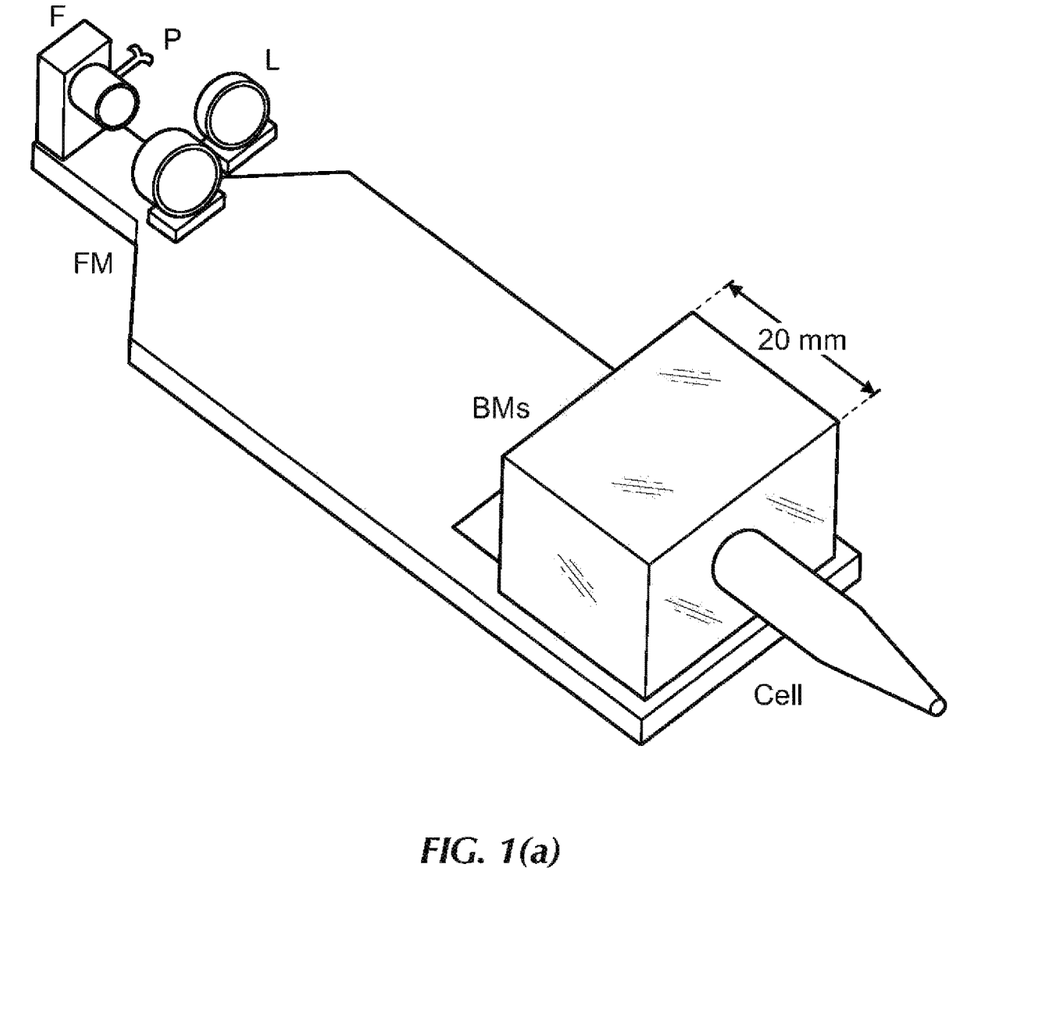
FIG. 1(a) depicts a sensor including a probe input focuser (F) and polarizer (P), anodically-bonded front/back (FM/BMs) spherical mirrors and a Pyrex cell enclosing both the back mirrors and the atomic vapor, output collimation lens (L) according to an embodiment of the present invention.
Figure 1B:
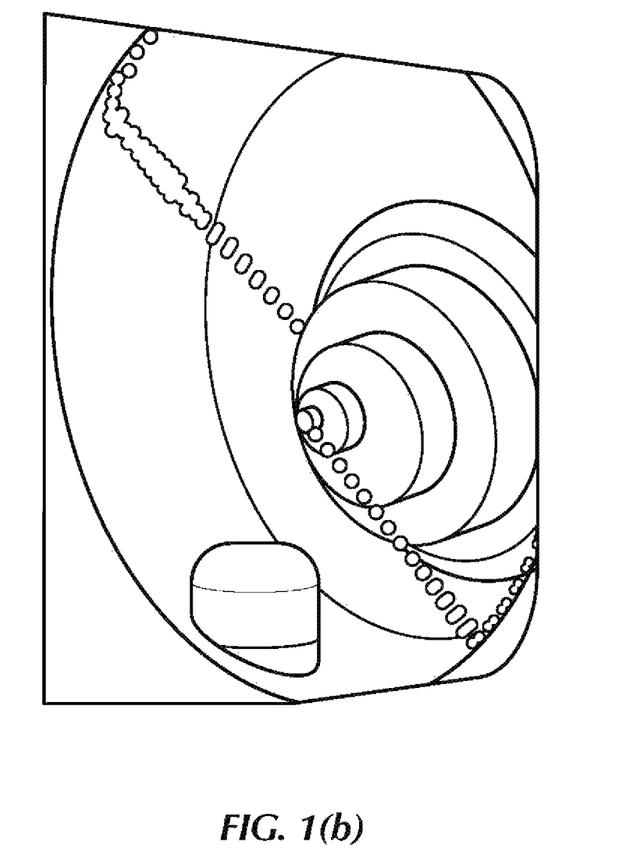
FIG. 1(b) depicts an IR image of the front mirror with probe beam spots after 60 total passes through atomic ensembles before exiting the cavity according to an embodiment of the present invention.

The sensor, shown in FIG. 1(a), includes at least three half-inch convex spherical mirrors, with 100 mm radius of curvature, which are actively aligned in a V-geometry to give the desired beam propagation and then anodically bonded through silicon wafers to a Pyrex plate. It should be noted that the dimensions, arrangement of mirrors, and measurements provided herein are exemplary and not intended to be limiting. However, the spot size on one mirror should be substantially smaller than the spot size on the other mirror or mirrors. Therefore, the distance between the mirrors should be about equal to their radius of curvature. The probe laser is fiber coupled, linearly polarized, and focused at near-zero angle into a 170 μm hole made at the center of the front mirror. The near-zero angle depends on the distance between the back mirrors and is generally in the range of 1-10 degrees. The hole should be substantially smaller to the diameter of the mirror and is generally less than 1 mm. Then the probe laser expands to a beam diameter of 3.6 mm at the back mirrors where it nearly overlaps (i.e., the center of each beam pass is shifted by substantially less than the beam diameter) while undergoing 60 multiple reflections between front and back mirrors. The number of reflections could range from a few to several hundred, though typically the more reflections, the better. Due to the non-zero input angle, the probe is refocused to the front mirror at different spots, in a number equal to half of the total beam passes, as shown in FIG. 1(b), before exiting the cavity. A beam pass is a beam going from front to back or back to front, and a reflection would be two beam passes.

Figure 1C:
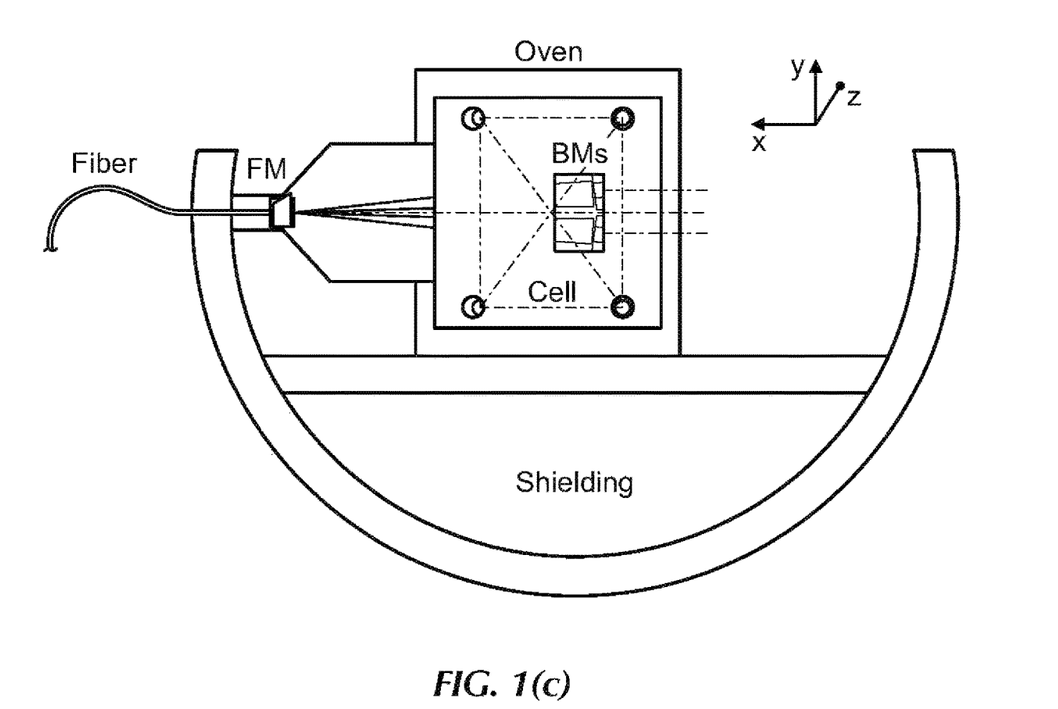
FIG. 1(c) depicts a cross-sectional view of the sensor within a magnetic shielding with the Pyrex cell enclosed by a boron-nitride oven where a magnetic field gradient is applied in the y direction, while probe (input fiber coupled) and pump beams (free space) propagate in the x and z directions, respectively, according to an embodiment of the present invention.

In order to make the atoms interact with a uniform wide beam, the atomic interaction is limited to the back region where a 2 cm wide Pyrex cell, which encloses the back mirrors, is also bonded to the plate through a second silicon wafer. The cell can be any length shorter than the cavity length (10 cm here) but is generally preferable to have the cell near the mirrors where the beam is large, so the laser beams mostly overlap inside the cell. The cell has an anti-reflection coated front window and is filled with pure $^{87}$Rb and $p_{N_2}$=90 Torr of $N_2$ buffer gas. The buffer gas provided herein is exemplary and alternative gases could be used. Optical probe beam transmission through the cavity after 60 passes is typically greater than 50%. The cell is heated with an AC electric current in a boron-nitride oven while the temperature is monitored by a thermocouple and stabilized to 0.1° C. The gradiometer structure stands within 5μ-metal layers of magnetic shielding, as shown in FIG. 1(c), and a concentric set of cylindrical coils (not shown). These generate the main field $B_z$ and a uniform gradient $\partial B_z/\partial y$.

Figure 1D:
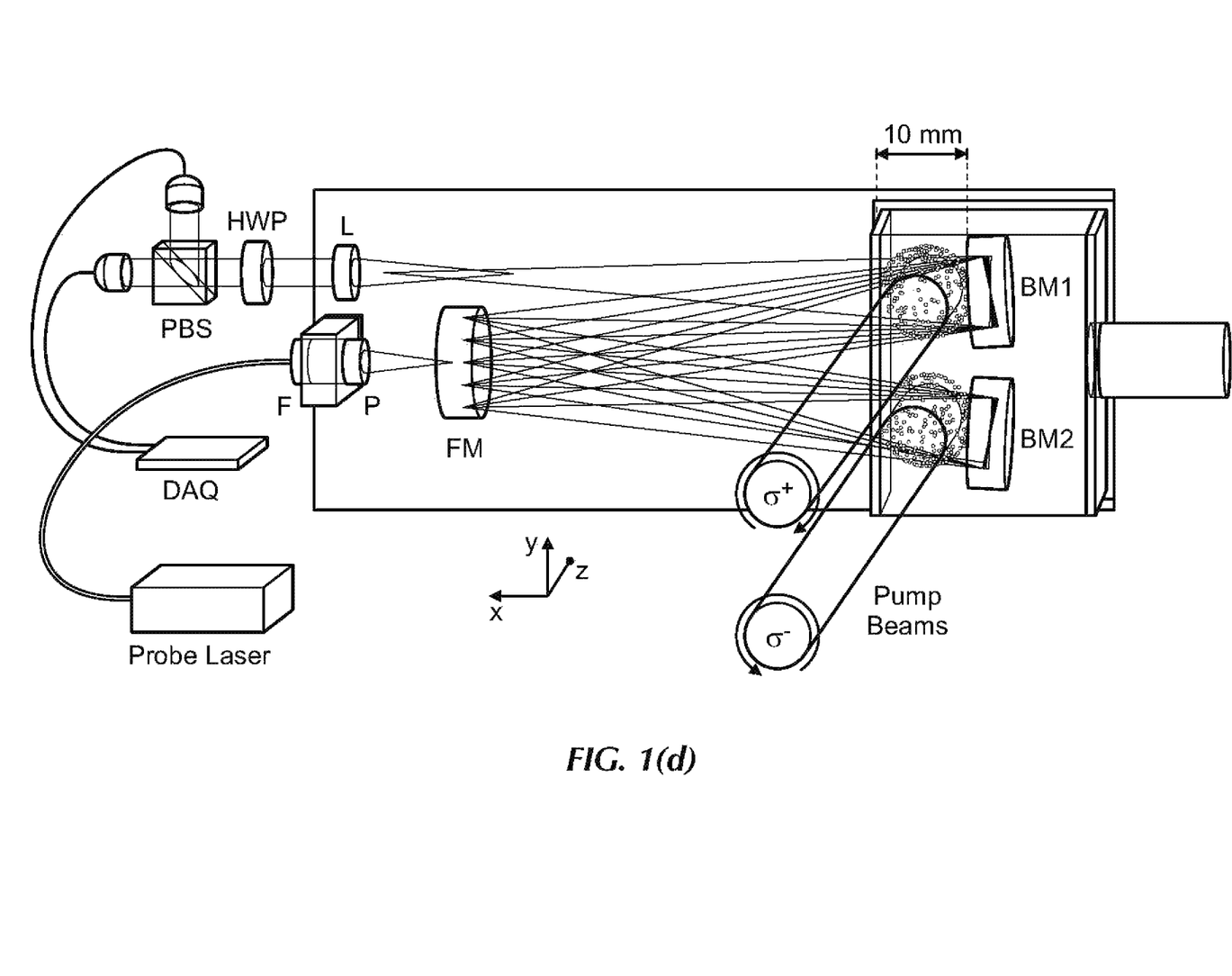
FIG. 1(d) depicts a diagram of the sensor including the focuser (F), polarizer (P), front mirror (FM), back mirrors (BMs), collimation lens (L), half wave plate (HWP), polarizing beam splitter (PBS), and data acquisition card (DAQ) according to an embodiment of the present invention.

The experimental scheme is shown in FIG. 1(d), in a simplified sketch with 12 probe passes. The experimental scheme includes a focuser (F), which focuses the laser onto an entrance hole on a front mirror (FM). Further included is a polarizer (P), which ensures the light is linearly polarized. In addition to the front mirror are back mirrors (BMs), which form the cavity. A collimation lens (L) is included to collimate the laser beam after it exits the cavity. A half wave plate (HWP) rotates the polarization of the beam at 45 degrees relative to a polarizing beam splitter (PBS), which splits the laser between two orthogonal state of polarization. A data acquisition card (DAQ) is included to acquire and save the data for later analysis.

Two atomic interaction areas are defined, addressed as top and bottom regions, where atoms are optically pumped with opposite polarization in the gradiometer operation mode with a baseline of 1.4 cm. After multiple reflections, the probe output is collimated and detected with a balanced polarimeter, whose differential signal is fed into a digital oscilloscope. The pump laser is a cw diode laser which is amplified by a tapered amplifier and tuned to the $^{87}$Rb D$_1$ line. A pulsed regime is generated by an acousto-optic-modulator and the first order diffracted beam is expanded and split into two parallel beams matching the atomic interaction areas. Top and bottom pump beams are circularly polarized with opposite ellipticity, $\sigma^+$ and $\sigma^-$, by two different quarter waveplates and are aligned along the z-axis to maximize initial atomic polarization. Atoms are pumped in the F=2 hyperfine state with $m_F$=2 and $m_F$=−2, i.e. parallel and anti-parallel with respect to the main field $B_z$, respectively.

Figure 1E:
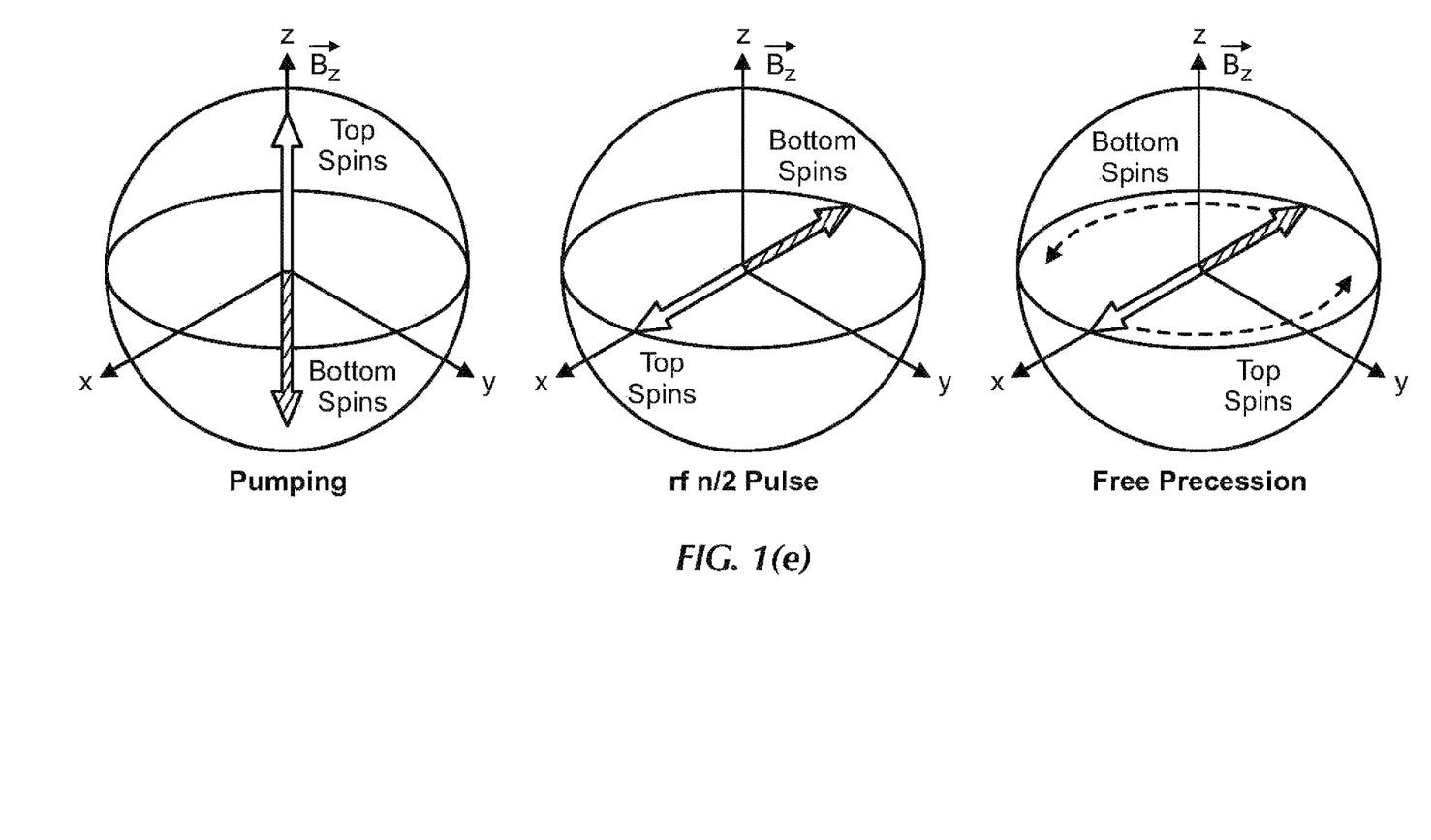
FIG. 1(e) depicts optically induced atomic orientation for top and bottom spins, angle tilt by π/2 pulse and free Larmor precession in the transverse plane according to an embodiment of the present invention.

The measurement sequence is depicted in FIG. 1(e). After 3 ms of cw optical pumping, a $\pi/2$ rf pulse with 30 cycles is applied to the $B_y$ coil to flip the spins in the transverse plane. At this point, top and bottom spins have opposite orientation in the x-direction, corresponding to a $\pi$ phase difference. An out-of-phase rf pulse is also applied to the gradient coil $\partial B_x/\partial y$ to create a small phase difference in spin precession signals for the two arms that compensates for the finite opening angle of the probe beam in the two arms of the V-cell.

After the $\pi/2$ pulse, the spins freely precess at the Larmor frequency $v_L=(\gamma/2\pi)B_z$, where $\gamma=g_F\mu_B/\hbar$ is the gyromagnetic ratio. The free induction decay (FID) is continuously recorded using paramagnetic Faraday rotation of the probe laser. The entire pump-tilt-probe cycle is repeated at driving period of $\tau$=16.666 ms.

Experimental Results and Data Analysis

The FID output signal of the polarimeter is given by:

$$V(t) = V_{ver}(t) - V_{hor}(t) = V_0 \sin\left(2\phi_0^{top}\sin\left(2\pi\left(v_L + \frac{\Delta v}{2}\right)t + d_0^{top}\right)e^{-t/T_2^{top}} - 2\phi_0^{bot}\sin\left(2\pi\left(v_L - \frac{\Delta v}{2}\right)t + d_0^{bot}\right)e^{-t/T_2^{bot}}\right) \quad (1)$$

where $V_0$ is the voltage corresponding to full probe intensity, $\phi_0^{top}$ ($\phi_0^{bot}$), $d_0^{top}$ ($d_0^{bot}$), and $T_2^{top}$ ($T_2^{bot}$) are the maximum rotation, the phase, and the transverse relaxation time of top (bottom) atomic ensemble, while $\Delta v$ is the difference in precession frequency due to the magnetic gradient.

Figure 2:
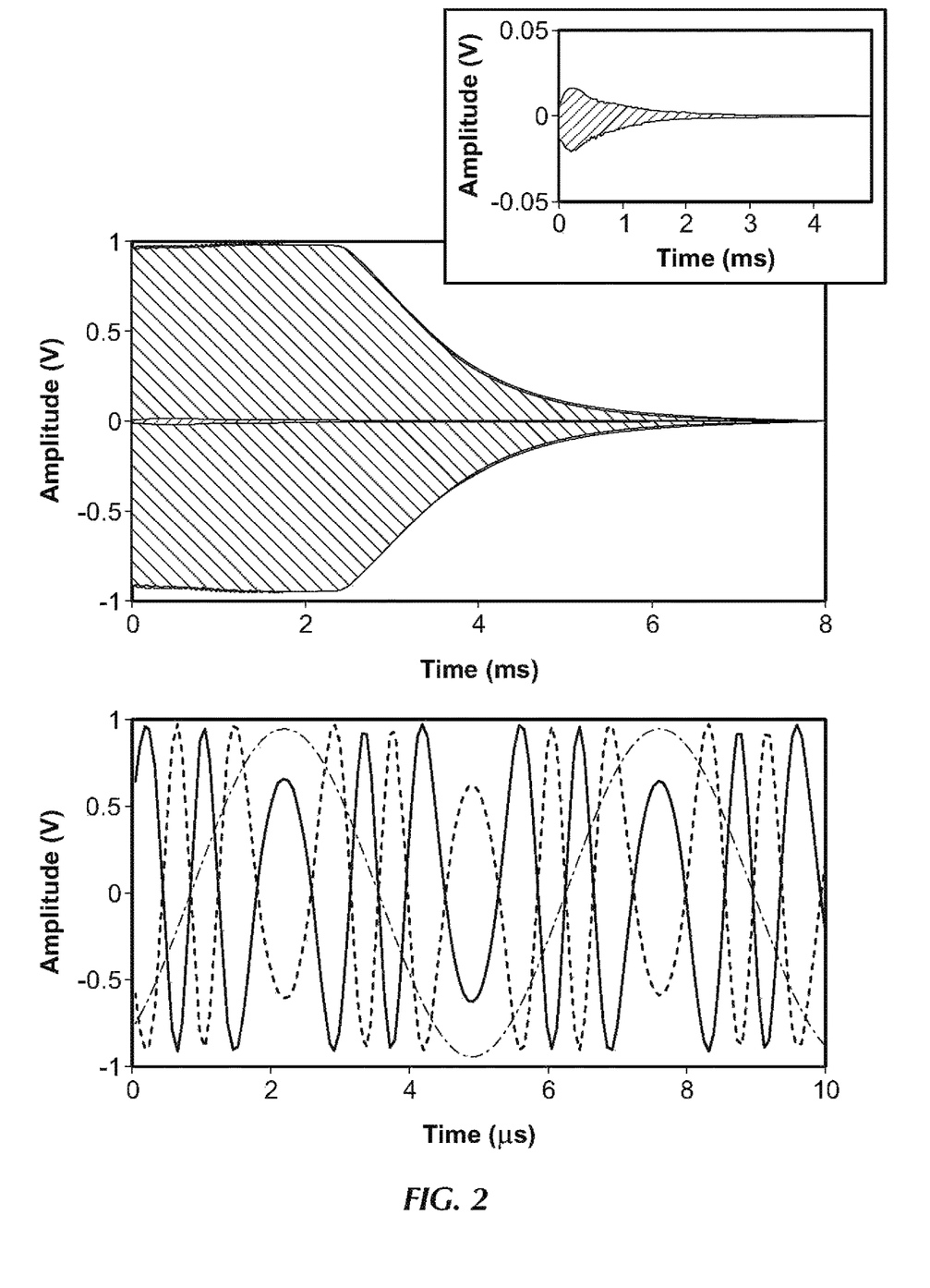
FIG. 2 depicts, at the top graph, individual and differential rotation signals at field $B_z$=26 μT, 400 μW probe power and T=120° C. with a zoom on the differential signal with direct cancellation at near-zero gradient, and on the bottom, individual signals over a shorter time scale showing a π phase difference between the $V_{top}$ and $V_{bot}$ contributions when the atomic ensembles are polarized with opposite circular polarization where the signals undergo multiple zero-crossing over a Larmor period of spin precession, according to an embodiment of the present invention.

FIG. 2 reports rotation signals $V_{top}(t)$ and $V_{bot}(t)$ at T=120° C., obtained by blocking one of the two pump beams, respectively. Each contribution has a maximum rotation of about 3.5 rad resulting in wrapping and multiple zero-crossing within a Larmor period. Over a shorter time scale, the opposite initial amplitude of the two signals is evident. Then, when both pump beams are on, they directly subtract, as shown in the inset of FIG. 2, resulting in an amplitude cancellation higher than 98%.

Figure 3:
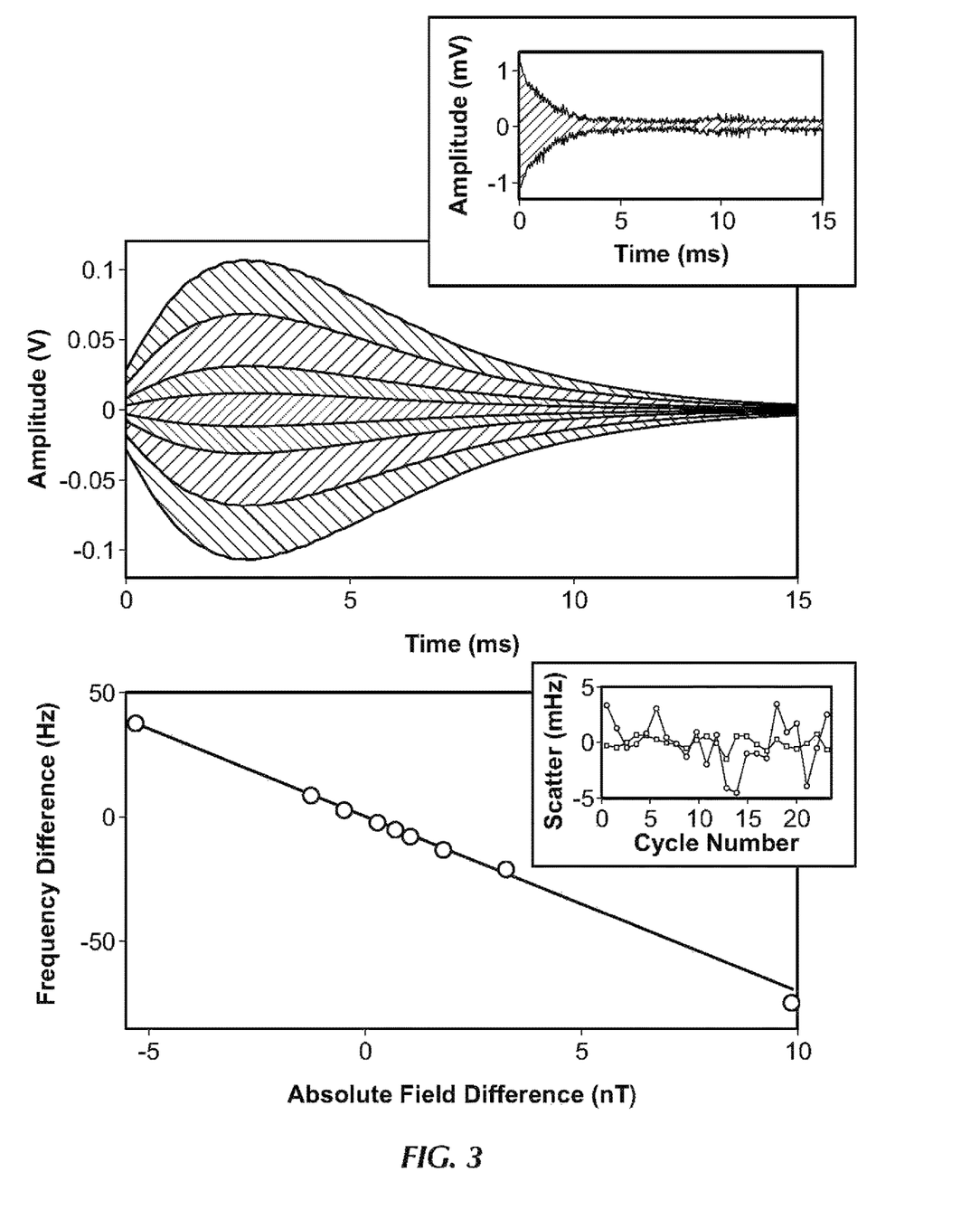
FIG. 3 depicts, at the top graph, gradiometer signal at applied gradient of (from top to bottom) 0.8 nT/cm, 0.5 nT/cm, 0.3 nT/cm and 0.1 nT/cm with an inset of a signal in absence of optical pumping showing fundamental noise and residual spin excitations, and on the bottom graph, experimental frequency difference and nominal gradient slope as a function of applied magnetic field difference with an inset showing a frequency difference scatter over multiple measurements for polarized and unpolarized atoms, according to an embodiment of the present invention.

FIG. 3 shows the dependence of this special direct signal on the applied uniform gradient at T=100° C., optimized for sensitivity. Due to the difference in precession frequency, the signal builds up from near-zero to reach a maximum, proportional to the applied gradient, then it decays due to relaxation in both contributions.

Two complementary data analysis and optimization procedures are disclosed herein. In the first strategy, the two contributions are independently fitted to get probe voltage amplitude $V_0$, initial rotation amplitudes $\phi_0$, precession frequencies $v_L$, phases $d_0$ and relaxation times $T_2$. These values typically agree within 1% between top and bottom signals. However, in Equation 1, $\phi_0^{bot}$ is replaced with $\phi_0^{top}+\Delta\phi$, $T_2^{bot}$ is replaced with $T_2^{top}+\Delta T_2$, and $d_0^{bot}$ is replaced with $d_0^{top}+\Delta d_0$. A third fit is performed to the direct gradiometer signal with $\{\Delta v, \Delta\phi, \Delta T_2, \Delta d_0\}$ as free parameters, to consider residual variations in all variables. Note that all four variables generate distinct differences in the signal shape and can be determined independently.

The frequency difference output $\Delta v$ is shown in FIG. 3 as a function of the absolute magnetic field difference $\Delta B=(\partial B_z/\partial y)\Delta y$ generated by the externally applied gradient $\partial B_z/\partial y$, including an offset of about 0.3 nT/cm for zeroing the residual background. The experimental slope agrees well with the nominal gradient coil calibration of 0.55 nT/(cm mA) and the $\Delta y$=1.4 cm gradiometer baseline. At fixed gradient, repetitive measurements are performed to get standard deviation in the frequency difference estimation $\sigma_{\Delta v}$ and the differential magnetic sensitivity $V_{\Delta v}=(2\pi/\gamma)\sigma_{\Delta v}/\sqrt{\Delta f}$, in T/$\sqrt{Hz}$ units, where $\Delta f=1/(2T_m)$ is the gradiometer bandwidth and $T_m$=2 ms is the fitting time for each signal, which is chosen for optimal sensitivity.

In the set of the lower graph in FIG. 3, an optimal experimental scatter with a 2.2 mHz standard deviation is reported, resulting in a measured sensitivity of 14.2 fT/$\sqrt{Hz}$ for a 1.4 cm baseline. The signal obtained without the pump beam is shown in the inset of the upper graph of FIG. 3. It includes spin noise and RF spin excitation of a residual spin polarization created by a slight circular polarization of the probe laser. Using the same fitting procedure on the residual spin excitation gives a standard deviation of 0.6 mHz, corresponding to a sensitivity of 3.6 fT/$\sqrt{Hz}$. The latter closely approaches the fundamental value of 2.7 fT/$\sqrt{Hz}$ obtained by numerical simulations of the signal, given by Equation 1 with the addition of photon shot noise and atomic spin noise, independently measured as described in the next section.

A second signal analysis method was also implemented that allows real-time measurements of the gradient signal and sensitivity. For small $\Delta v$, $\Delta\phi_0$, $\Delta T_2$, $\Delta d_0$, (i.e., the difference is a few percent), Equation 1 can be expanded to obtain:

$$V(t) = V_0\left(2\phi_0(\Delta d_0 + 2\pi\Delta vt)\cos(2\pi v_L + d_0) + 2\left(\Delta\phi_0 + \frac{\phi_0\Delta T_2 t}{T_2^2}\right)\sin(2\pi v_L + d_0)\right)e^{-t/T_2} \quad (2)$$

One can see that the gradient signal $\Delta v$ appears out-of-phase from the individual top and bottom signals. The phase of a fast Fourier transform (FFT) is adjusted until the signal of $\{\Delta\phi_0, \Delta T_2\}$ appears in a real part of the FFT and a signal of $\{\Delta v, \Delta d_0\}$ appears in an imaginary part of FFT. This appropriately phased FFT is performed on the FID data and the real and imaginary Fourier components are separately looked at, which each depend on pairs of unknown parameters $\{\Delta\phi_0, \Delta T_2\}$ and $\{\Delta\nu, \Delta d_0\}$, respectively. This is done experimentally by performing FFT on each shot in real time. To optimally extract the signal $\Delta\nu$, FID should be multiplied by a custom window function before doing FFT. Generally, the optimal window function to maximize SNR in the presence of white noise is a matched filter equal to the envelope of the signal, here $$\omega(t) = \left(\frac{t}{T_2}\right)e^{-t/T_2}.$$

It is determined that this real-time method gives similar sensitivity to the non-linear fitting approach.

Noise Analysis

Figure 4:
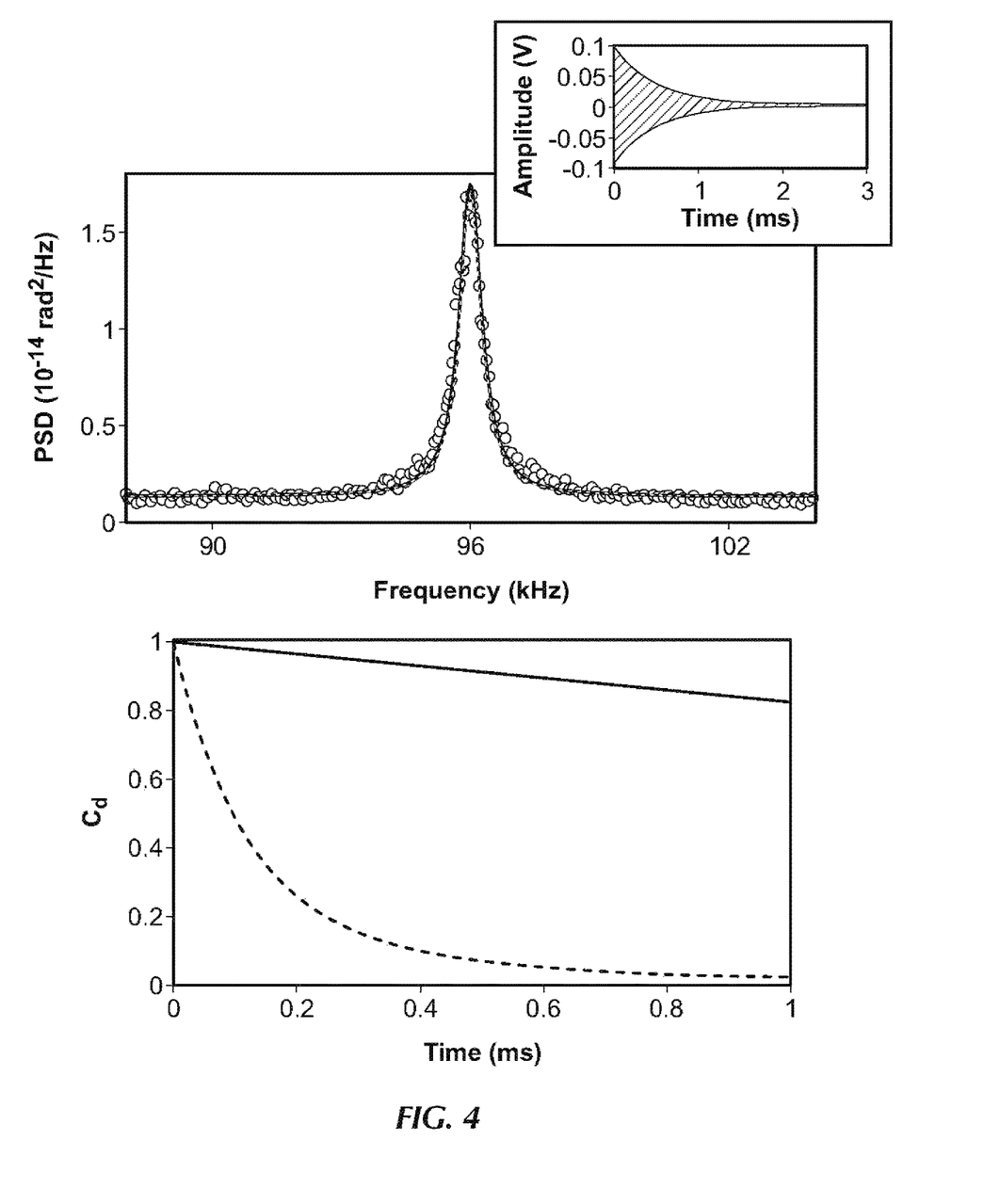
FIG. 4 depicts, at the top graph, experimental spin noise spectrum centered at Larmor frequency $v_L$=96 kHz and a simple Lorentzian fit for unpolarized atomic ensemble under thermal equilibrium at T=120° C. where prediction for spin noise spectrum including effects of diffusion without free parameters with an inset showing free induction decay signal for low initial polarization, where spin-exchange collisions limit the transverse relaxation time, and on the bottom graph, a comparison of diffusion correlation functions including calculated diffusion correlation function for the V-shaped multi-pass cell in comparison to the diffusion correlation function in a cylindrical mirror multi-pass cavity, according to an embodiment of the present invention.

When the atoms are polarized in the gradiometer operation mode, the sensitivity is limited by random spin excitations, due to rf broadband noise and pump fluctuations, resulting in a noise amplitude higher than the fundamental atomic noise. In FIG. 4, the spin noise power spectrum is reported, measured at T=120° C. by probing intrinsic fluctuations of the unpolarized ensemble with a red-detuning of 200 GHz from the F=2 state. The $\pi/2$ pulses are also not applied, so the residual spin polarization of the atoms is not excited. It can be seen that the peak spin noise power spectral density exceeds the background noise power spectral density by more than a factor of 10, indicating good quantum-non-demolition (QND) resolution of the multipass cell.

The spin noise power spectrum is $S(\nu) = \langle\phi(t)^2\rangle \int_{-\infty}^{\infty} C(|\tau|) e^{-i2\pi\nu\tau} d\tau$, where $C(|\tau|) = C_d(\tau)e^{-t/T_2}$ is the normalized spin noise time-correlation function, set by spin relaxation processes and the diffusion correlation function $C_d(\tau)$. The latter can modify the spectrum lineshape while not affecting the total rotation noise variance $\langle\phi(t)^2\rangle$. For 60 passes through a 1 cm long Rb vapor with measured density $n=1.75\times10^{13}$ cm$^{-3}$, theoretical optical rotation rms noise of $\phi_{rms}^{exp}=3.6\times10^{-6}$ rad is calculated. This is in good agreement with the measured area under the noise of $\phi_{rms}^{exp}=3.8\times10^{-6}$ rad after subtraction of the background noise floor of $\phi_{ph}=3.7\times10^{-8}$ rad/Hz$^{1/2}$.

If the noise peak is fit to a Lorentzian (shown by the solid line in FIG. 4), it gives a width at half-maximum (FWHM) equal to 640 Hz. The transverse relaxation time of a small coherent excitation obtained in the regime of low spin polarization, shown in the inset of FIG. 4, is equal to $T_2=0.55$ ms, which corresponds to a FWHM=$1/(\pi T_2)$=580 Hz. The difference between the two linewidths is due to effects of atomic diffusion on the spin noise spectrum. However, due to the overlapping of multiple probe beams with uniform diameter of 3.6 mm the spectrum is nearly a pure Lorentzian shape, in contrast to prior work with multi-pass cells where, due to different transit times and varying probe focusing, the spin noise linewidth was limited by atomic diffusion, resulting in a distribution of Lorentzian functions.

In the regime where the probe beam Rayleigh range is much larger than the length of the atomic vapor, the diffusion correlation function is given by $$C_d^{th}(t) = 1 / \left(1 + \frac{4tD}{\omega_0^2}\right),$$

where D is the diffusion constant and $\omega_0$ is the Gaussian beam radius, D=1.5 cm$^2$/s and $\omega_0$=1.8 mm here. The expected spin noise spectrum is shown with the dashed line in FIG. 4 for $T_2$=0.55 msec. There is excellent agreement with the measured spectrum without any free parameters.

To illustrate the difference in the diffusion correlation functions, FIG. 4 also shows a comparison of the correlation function in the present experiment and in a prior multi-pass cavity configuration. The multi-pass configuration disclosed herein, in addition to the high optical depth, provides a fundamental advantage with the possibility of improving the long-term sensitivity by spin squeezing, because quantum correlations could be preserved in a dense vapor despite of atomic diffusion.

CONCLUSION

As such, generally disclosed herein are embodiments for a direct magnetic gradiometer showing a near-zero signal despite of the high optical rotation introduced by two atomic ensembles. The sensor includes a single multipass cell, in contrast to prior geometries, based on either two vapor cells or two output signals. The intrinsic cancellation of large polarization rotations, typical in state-of-the-art optical magnetometry, avoids complications related to signal processing. Two analysis methods are also developed for the special signal and sensitivity of 10.1 fT/$\sqrt{\text{Hz}}$ was measured with 1.4 cm baseline and femtotesla projected sensitivity.

The described gradiometer is also a multipass atomic sensor with a nearly pure Lorentzian spin noise spectrum, where atomic diffusion is not significantly affecting the time-correlation of the spin noise. In a quantum-noise-limited regime, this would allow suppression of atomic spin noise due to spin squeezing while the sensitivity could be further improved by using a squeezed light probe.

It is expected the V-cell gradiometer will work particularly well for cancellation of broadband magnetic noise in an unshielded environment since it relies on direct real-time subtraction of two signals. Therefore, a direct gradiometer is more promising for applications in challenging environments. Finally, the direct gradiometer could be further miniaturized with an anodic bonding fabrication technique.

It is understood that the above-described embodiments are only illustrative of the application of the principles of the present invention. The present invention may be embodied in other specific forms without departing from its spirit or essential characteristics. All changes that come within the meaning and range of equivalency of the claims are to be embraced within their scope. Thus, while the present invention has been fully described above with particularity and detail in connection with what is presently deemed to be the most practical and preferred embodiment of the invention, it will be apparent to those of ordinary skill in the art that numerous modifications may be made without departing from the principles and concepts of the invention as set forth in the claims.

What is claimed is:

1. A direct magnetic gradiometer having intrinsic subtraction of rotation signals from two atomic ensembles within a single multi-pass cell, the gradiometer comprising:
   three convex spherical mirrors aligned in a V-shape geometry, the three convex spherical mirrors comprising a front mirror and two back mirrors; and
   a probe laser beam configured to:
      be initially focused at a near-zero angle into a hole at a center of the front mirror such that the laser beam expands at the back mirrors and nearly overlaps with itself while undergoing multiple reflections between the front and back mirrors; and be refocused to the front mirror at different spots in a number equal to half of total beam passes before exiting.

2. The gradiometer of claim 1, wherein the single multi-pass cell encloses the two back mirrors.

3. The gradiometer of claim 1, wherein the single multi-pass cell has an anti-reflection coated front window.

4. The gradiometer of claim 1, wherein the laser beam is linearly polarized.

5. The gradiometer of claim 1, further comprising a collimation lens, a half wave plate, and a polarizing beam splitter.

6. The gradiometer of claim 1, wherein the single multi-pass cell is filled with $^{87}$Rb.

7. The gradiometer of claim 1, further comprising two pump lasers configured to polarize atoms in opposite directions to subtract their signals.

8. An optical arrangement comprising:
  a laser beam configured to be focused into an arrangement of at least three convex spherical mirrors, the mirrors being pre-aligned to expand the laser beam such that the laser beam nearly overlaps with itself while undergoing multiple reflections between the mirrors and then exits the arrangement of mirrors after a predetermined number of beam passes,
  wherein the laser beam is configured to be refocused to a front mirror of the mirrors at different spots in a number equal to half of the predetermined number of beam passes before exiting.

9. The optical arrangement of claim 8, further comprising a single multi-pass cell that encloses two back mirrors of the mirrors.

10. The optical arrangement of claim 9, wherein the single multi-pass cell has an anti-reflection coated front window.

11. The optical arrangement of claim 9, wherein the single multi-pass cell is filled with $^{87}$Rb.

12. The optical arrangement of claim 8, wherein the laser beam is linearly polarized.

13. The optical arrangement of claim 8, further comprising a collimation lens, a half wave plate, and a polarizing beam splitter.

14. The optical arrangement of claim 8, further comprising at least one pump laser configured to polarize atoms in opposite directions to subtract their signals.

15. A method for operating an optical arrangement, the optical arrangement including a laser beam and three convex spherical mirrors aligned in a V-shape geometry, the three convex spherical mirrors including a front mirror and two back mirrors, the method comprising:
  initially focusing the laser beam at a near-zero angle into a hole at a center of the front mirror such that the laser beam expands at the back mirrors and nearly overlaps with itself while undergoing multiple reflections between the front and back mirrors; and
  refocusing the laser beam to the front mirror at different spots in a number equal to half of total beam passes before exiting.

16. The method of claim 15, further comprising linearly polarizing the laser beam.

17. The method of claim 15, further comprising collimating the exited laser beam.

18. The method of claim 15, further comprising detecting a differential signal from the exited laser beam.

19. The method of claim 15, further comprising continuously recording a free induction decay.

* * * * *